United States Patent [19]

Baldi

[11] 4,349,612

[45] Sep. 14, 1982

[54] METAL WEB

[75] Inventor: Alfonso L. Baldi, Wynnewood, Pa.

[73] Assignee: Alloy Surfaces Company, Inc., Wilmington, Del.

[21] Appl. No.: 25,456

[22] Filed: Mar. 30, 1979

Related U.S. Application Data

[63] Continuation-in-part of Ser. No. 963,313, Nov. 27, 1978, abandoned, Ser. No. 851,504, Nov. 14, 1977, Ser. No. 809,189, Jun. 23, 1977, and Ser. No. 752,855, Dec. 21, 1976, Pat. No. 4,208,453, each is a continuation-in-part of Ser. No. 614,834, Sep. 19, 1975, Pat. No. 4,141,760, said Ser. No. 851,504, Ser. No. 809,189, and Ser. No. 752,855, each is a continuation-in-part of Ser. No. 694,951, Jun. 11, 1976, abandoned, which is a continuation-in-part of Ser. No. 614,834, , which is a continuation-in-part of Ser. No. 466,908, May 3, 1974, Pat. No. 3,958,047, Ser. No. 404,665, Oct. 9, 1973, Pat. No. 3,948,689, Ser. No. 357,616, May 7, 1973, Pat. No. 3,948,687, said Ser. No. 404,665, and Ser. No. 357,616, each is a continuation-in-part of Ser. No. 254,403, May 18, 1972, Pat. No. 3,785,854, Ser. No. 90,682, Nov. 18, 1970, Pat. No. 3,764,371, and Ser. No. 219,514, Jan. 20, 1972, Pat. No. 3,801,357, said Ser. No. 90,682, and Ser. No. 219,514, each is a continuation-in-part of Ser. No. 837,711, Jun. 30, 1969, abandoned.

[51] Int. Cl.$^3$ .................. B32B 15/01; B32B 15/04; B32B 15/18

[52] U.S. Cl. .................... 428/607; 102/336; 148/6.15 R; 149/15; 252/477 Q; 428/606; 428/457; 428/649; 428/660; 428/687; 428/613; 428/624

[58] Field of Search .............. 428/606, 607, 457, 649, 428/660; 252/477 Q; 431/99; 148/6.15 R; 149/15; 102/336

[56] References Cited

U.S. PATENT DOCUMENTS

| | | | |
|---|---|---|---|
| 2,094,117 | 9/1937 | Byrkit, Jr. | 260/100 |
| 2,094,578 | 10/1937 | Blumenthal et al. | 428/606 X |
| 2,604,455 | 7/1952 | Reynolds et al. | 252/412 |
| 3,068,157 | 12/1962 | Vielstich et al. | 204/99 |
| 3,111,396 | 11/1963 | Ball | 73/222 X |
| 3,165,478 | 1/1965 | Hauschild et al. | 252/413 |
| 3,248,787 | 5/1966 | Plust et al. | 29/420 |
| 3,272,728 | 9/1966 | Hahndorff et al. | 204/35 |
| 3,379,635 | 4/1968 | von Doehren et al. | 252/477 Q X |
| 3,408,230 | 10/1968 | Dickinson et al. | 156/656 |
| 3,408,231 | 10/1968 | Dickinson et al. | 156/656 |
| 3,448,060 | 6/1969 | Mason | 252/477 Q X |
| 3,560,404 | 2/1971 | Jung et al. | |
| 3,631,835 | 1/1972 | Hamontre et al. | 428/607 X |
| 3,637,437 | 1/1972 | Goldberger | 429/44 |
| 3,785,854 | 1/1974 | Baldi | 428/651 |
| 3,801,357 | 4/1974 | Baldi | 427/250 |
| 3,846,344 | 11/1974 | Larson, Jr. et al. | 252/466 J |
| 3,900,602 | 8/1975 | Rummel | 427/115 |
| 3,928,442 | 12/1975 | Seale et al. | 252/477 Q X |
| 3,939,097 | 2/1976 | Takeoka et al. | 252/464 |
| 3,958,047 | 5/1976 | Baldi | 427/282 X |
| 4,040,981 | 8/1977 | Inaba et al. | 252/463 |
| 4,043,945 | 8/1977 | Fukui et al. | |
| 4,049,580 | 9/1977 | Oden et al. | 252/466 J |
| 4,086,149 | 4/1978 | Martinsons et al. | 204/59 R |
| 4,116,804 | 9/1978 | Needes | 204/284 |
| 4,141,760 | 2/1979 | Baldi | 148/31.5 |
| 4,169,025 | 9/1979 | Needes | 204/98 |
| 4,170,574 | 10/1979 | Inaba et al. | 252/472 |
| 4,171,669 | 10/1979 | Allen | 102/37.6 |
| 4,175,954 | 11/1979 | Oden et al. | 75/138 |
| 4,176,092 | 6/1977 | Birkenstock et al. | |

FOREIGN PATENT DOCUMENTS

| | | | |
|---|---|---|---|
| 592130 | 2/1934 | Fed. Rep. of Germany | 429/218 |
| 1019361 | 11/1957 | Fed. Rep. of Germany | 429/223 |
| 1909031 | 9/1970 | Fed. Rep. of Germany | |
| 2209000 | 9/1972 | Fed. Rep. of Germany | |
| 2209000 | 11/1975 | Fed. Rep. of Germany | 252/477 Q |
| 282112 | 11/1929 | United Kingdom | |
| 692300 | 6/1953 | United Kingdom | 252/414 |
| 1289751 | 9/1972 | United Kingdom | 429/218 |

OTHER PUBLICATIONS

Yasumura et al.: "Laminated Raney Nickel Catalyst", Ind. Eng. Chem. Prod. Res. Develop., vol. 11, No. 3, 1972, pp. 290–293.
Yasumura et al. I & ED Product Research and Development vol. 7, 12/4/68 pp. 252–254.
W. Vielstich Chemie-Ing-Techn vol. 33, No. 2, pp. 75–79.
Chemiker Zeitung, vol. 99, pp. 447–448 (1975).

*Primary Examiner*—Richard D. Lovering
*Attorney, Agent, or Firm*—Connolly & Hutz

[57] ABSTRACT

A metal web having a pyrophoric surface is coated by a solid or liquid that does not block the pyrophoric property and undergoes a pyrophoricity-intensifying exothermic change when subjected to the pyrophoricity of that surface.

8 Claims, No Drawings

METAL WEB

This application is in part a continuation of applications Ser. No. 963,313 filed Nov. 27, 1978 (subsequently abandoned), Ser. No. 851,504 filed Nov. 14, 1977, Ser. No. 809,189 filed June 23, 1977 and Ser. No. 752,855 filed Dec. 21, 1976, now U.S. Pat. No. 4,208,453, all of which are in turn continuations-in-part of application Ser. No. 614,834 filed Sept. 19, 1975 (now U.S. Pat. No. 4,141,760 granted Feb. 27, 1979) and the last three of which are also continuations-in-part of application Ser. No. 694,951 filed June 11, 1976 (subsequently abandoned) which in its turn is also a continuation-in-part of Ser. No. 614,834. That Ser. No. 614,834 is a continuation-in-part of applications Ser. No. 466,908 filed May 3, 1974 (now U.S. Pat. No. 3,958,047 granted May 18, 1976), Ser. No. 404,665 filed Oct. 9, 1973 (now U.S. Pat. No. 3,948,968 granted Apr. 6, 1976) and Ser. No. 357,616 filed May 7, 1973 (now U.S. Pat. No. 3,948,687 granted Apr. 6, 1976), the last two of which are continuations-in-part of applications Ser. No. 254,403 filed May 18, 1972 (now U.S. Pat. No. 3,785,854 granted Jan. 15, 1974), Ser. No. 90,682 filed Nov. 18, 1970 (now U.S. Pat. No. 3,764,371 granted Oct. 9, 1973) and Ser. No. 219,514 filed Jan. 20, 1972 (now U.S. Pat. No. 3,801,357 granted Apr. 2, 1974), the two last-mentioned being continuations-in-part of application Ser. No. 837,811 filed June 30, 1969 (subsequently abandoned).

The present invention relates to the diffusion coating of metals.

Among the objects of the present invention is the provision of novel coating techniques and compositions for use therewith, as well as novel coated products, all suitable for commercial operations.

The parent applications refer to the preparation of active metal surfaces by diffusion coating a metal such as nickel, platinum, iron or the like, and then dissolving out the material introduced by the diffusion. Thus a pure nickel sheet can be diffusion coated with aluminum by a 20–30 hour 1150°–1250° F. heat in an $AlCl_3$-activated powder pack of 20% aluminum and 80% alumina, bathed in hydrogen, following which the diffusion-coated product is subjected to the leaching treatment described in U.S. Pat. No. 3,958,047.

When a nickel surface of high catalytic activity is desired, the nickel is best subjected to diffusion aluminizing in a plurality of stages before the leaching. In the first diffusion stage the activity of the inwardly diffusing aluminum is kept low, as by using an aluminum diffusion pack containing 10 to 40% aluminum, the balance alumina, with a 0.3% $AlCl_3$ energizer added. A diffusion treatment of 1050° to 1100° F. for 20 to 30 hours with such a pack causes the formation on the nickel surface of an aluminized case in which essentially all its aluminum is in the form of $Ni_2Al_3$ intermetallic.

In a subsequent diffusion aluminizing stage the outer portion of the aluminized case is modified to convert the $Ni_2Al_3$ to a higher aluminide of nickel. The aluminizing pack of the first stage can be used in a second stage conducted at a lower temperature, as for example from about 880° to about 920° F., for 20 to 30 hours as an effective technique for converting the aluminide in the outermost portion of the case to higher aluminide.

These two diffusion steps are the only ones needed, and nickel so treated and then leached with 5 to 50% aqueous caustic soda has an exceptionally good catalytic action in hydrogenation reactions such as the hydrogenation of benzene or phenol or coal as in coal gasification. This double diffusion is illustrated in the following example.

EXAMPLE

A six-foot square section of nickel screening is solvent degreased, placed in a previously aluminized steel retort containing a mix of 20% Al (40 microns) and 80% $Al_2O_3$ (325 mesh) with $\frac{1}{2}$% $AlCl_3$ distributed throughout the mix. Diffusion coating is effected in $H_2$ at 1050°–1100° F. for 25 hours to provide a 0.006 inch case of primarily $Ni_2Al_3$. The diffusion coating step is then repeated using the same pack mixture as above but this time at a temperature of 850° to 900° F. for 30 hours to provide a predominately $NiAl_3$ 1 mil thick coating on top of the aforementioned $Ni_2Al_3$ coating. The resulting screen is washed, dried, and stored or leached. Treatment with 20% NaOH at room temperature primarily leaches out the Al from the $NiAl_3$ layer with minor effect on the $Ni_2Al_3$ layer. When the leaching action has subsided, the screen is washed and immediately placed in a liquid such as cyclohexane to prevent surface oxidation until ready for use. Poorly volatile liquids such as kerosene or triethanolamine, or congealable liquids such as melted wax can be used to protect the active surface while the screen is installed in the hydrogenating equipment and can then be washed off. The double diffusion can also be effected on sheet, foil or tubes, as well as on nickel that is plated on a support such as steel, with equally good results. In general at least about 1 mil of $Ni_2Al_3$ case should be present in the leached product below the activated surface layer left by the leaching. Also that activated surface layer should be at least about 0.5 mil deep.

The second aluminizing stage can, if desired, be effected by merely extending the time during which the nickel being treated cools down after the completion of the first stage. Thus the furnace heat can be turned on again during the initial cool-down, when the retort temperature reaches about 925° F. and can then hold the desired second stage temperature.

The improved activity resulting from the foregoing dual diffusion is not noticeable when preparing activated platinum by diffusing aluminum into it and then leaching. However activated platinum prepared in this way is more stable and can be exposed to air without loss of activity. Indeed when such activated platinum is used as an igniter for hydrogen, a job it does well at and even below room temperature, it is preferably kept exposed to air when not doing any igniting. It can also be advantageously arranged to be held in a stream of a mixture of air and hydrogen as that stream flows to a hydrogen-burning jet, and in a location relatively close to but upstream from that jet, so that the active platinum assures the ignition of the stream yet remains out of the flame burning at the jet. In such arrangement the dual diffusion of the aluminum is not needed.

Catalytically activating the surface of a metal foam, such as the nickel foam described in U.S. Pat. No. 3,111,396 is particularly desirable inasmuch as such a foam presents a very large metal surface and does not have the fragility of thin foil or screening. The diffusion-coating treatment generally introduces into the surface of the metal being activated a relatively high concentration of an embrittling metal such as aluminum, and fragile shapes such as foil and thin screening tend to break unless very carefully handled during this treatment.

The catalytic activation of platinum and other metals of the platinum family is preferably applied to very thin substrates in the interest of reducing the amount of such expensive metals needed, and here also a metal foam shape as described in U.S. Pat. No. 3,111,396 is desirable.

To minimize having thin nickel foil rendered too fragile the diffusion step can be carried out at minimum temperatures to reduce the depth of the diffusion case. Thus a 0.1 to 0.5 mil case can be provided on a nickel foil 1 to 2 mils thick by aluminizing at a temperature between 650° and 800° F.

The fragility of thin foils when diffusion coated, can also be offset by having the metal of the foil in the form of a surface layer securely held on a carrier foil or sheet made of metal that does not have the objectionable fragility and can be subsequently separated from that surface layer. Thus a 5 mil thick aluminum sheet can be electroplated on one face with a one mil thick layer of nickel or cobalt, using a preliminary flash coating of chromium or zinc to get the nickel or cobalt to adherently deposit. The final coated aluminum sheet is then subjected to a 20-hour diffusion treatment at 750° to 850° F. in a hydrogen-bathed atmosphere to cause the aluminum to diffuse most of the way through the nickel or cobalt layer, after which the resulting product is subjected to caustic leaching to dissolve the aluminum. This leaves a catalytically active nickel or cobalt foil that contains a residual small content of diffused-in aluminum and holds itself together adequately for normal handling. Although pyrophoric, its catalytic activity is not as high as is available from a pack diffusion process without the aluminum carrier sheet, but it does a good job of catalyzing hydrogenation and other chemical reactions including ammonia oxidation and HCN formation. Of particular interest, a Ni or Co plating formed by electroplating in the above manner has a particularly low density thus limiting the amount of mass needed per unit volume of catalyst.

Both faces of the aluminum sheet can be given nickel or cobalt platings in which case the corners or edges of the plated sheet can be trimmed off to expose the aluminum substrate for leaching.

A very effective zinc flash for the foregoing plating sequence is obtained by a ½ to 1 minute dip of the cleaned aluminum sheet at room temperature in the following solution:

NaOH: 525 grams
ZnO: 100 grams
$FeCl_3.6H_2O$: 1 gram
$NaKC_4H_4O_6.4H_2O$: 10 grams
Water: to make one liter Platinum and other catalytic metals can similarly be converted to catalytic foil, and other leachable metals like zinc can be used as the supporting foil in place of aluminum. The supporting layer can also be made by spraying molten aluminum or zinc on a surface of the foil that is to be activated.

Palladium is best catalytically activated with zinc. A simple diffusion of about 1 to 30 milligrams of zinc per square centimeter of palladium surface, followed by leaching with strong, at least 10%, HCl in water at 95° C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% $NH_4Cl$, and heating for 4 hours at 600° F. in a hydrogen-bathed atmosphere. This effects a zinc pick-up of 4 mg/cm², essentially all of which is leached out by 20% HCl in 10 minutes. The resulting screen is pyrophoric when exposed to air.

Zinc can be similarly diffused into titanium foil in a hydrogen-bathed atmosphere from such a zinc-containing pack. As an example a 4 mil thick titanium foil is embedded in a pack having the following composition:

80 g: Zn
16 g: Al
305 g: $Al_2O_3$
4 g: $AlCl_3$ and subject to 10 hours of diffusion at 950° to 1000° F. The foil picks up about 3.5 milligrams of zinc per square centimeter. It is worthy of note that the titanium does not become seriously embrittled by such treatment, and can be bent around a ⅛-inch radius without cracking. The diffused-in-zinc can be leached out with 20% boiling NaOH solution to leave a very active catalytic surface. Titanium activated this way can be used as a conventional electrolysis electrode, or as a substrate for the photosensitive electrodes described in the Augustynski et al paper in the Journal of the Electrochemical Society, Volume 124, No. 7, pages 1063-64 (1977).

For some purposes, such as catalytic alkylation, it is helpful to have a catalytic tin surface. Inasmuch as tin is a very low melting metal, it is helpful to first diffuse the tin into a high-melting support such as nickel. By way of example an 80-mesh nickel gauge made of 4 mil thick wire, is embedded in the following pack:

Tin powder: 73 grams
Nickel powder: 27 grams
Alumina: 300 grams
$NH_4Cl$: 4 grams which pack had been pre-fired at 1000° F. for 5 hours and then had its $NH_4Cl$ content replenished. Diffusion is conducted in hydrogen at 1400° F. for 5 hours to give a 20 milligram per square centimeter pick-up. The resulting tin-containing gauze after removal from the pack, is subjected to post diffusion by heating in hydrogen at 1600° to 1700° F. for 5 hours to leave the diffusion case about 1.3 mils thick. This product is now activated by a pack diffusion at 850° to 900° F. for 30 hours using a pack having 20% powdered aluminum, 80% powdered alumina, and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1 mil thick layer of copper on a 1 mil thick palladium foil, heating the copper-palladium combination in hydrogen at 1050°–1100° F. for 12 hours to diffuse the copper deeply into the palladium, and then diffusion coating the resulting product under hydrogen in a pack containing 10% zinc, 90% alumina, and activated with ½% $NH_4Cl$. Ten hours of such treatment at 660°–690° F. produces a pick-up of about 7 milligrams of zinc per square centimeter of foil surface and a 0.7 mil thick case the surface stratum of which contains about 25% zinc. The final step in the activation is a leaching in 30% HCl for 3 minutes at about room temperature followed by 10 minutes more at about 212° F. in 15% HCl.

The pack diffusion to activate the catalyst can be effected in one step or in multiple steps under different diffusion conditions to vary the distribution of the diffused-in-metal. Regardless of how the diffusion is carried out, the catalytic activity of the leached product can be entirely blocked by immersing the activated surface in an aqueous solution of a chromate such as an alkali metal, magnesium or ammonium chromate or chromic acid. A concentration of about 1% chromate ion is all that is needed to inhibit essentially all the catalytic activity of nickel or platinum for example, after only a few second contact. Smaller concentrations, as low as 0.1% chromate ion, will also be effective if kept in contact for longer times.

A catalyst so inhibited can be conveniently stored or shipped without being immersed in a protective liquid. Moreover the catalyst can subsequently be reactivated by merely treating it for about 2 minutes with 5% aqueous NaOH, preferably at 90° C. Rinsing away this treating liquid will then leave the catalyst with almost all of its original activity.

A highly pyrophoric nickel screen can be subjected to evacuation at about 10 millimeters or less of mercury will still be catalytic. The evacuation takes a minute or more, indicating that hydrogen had been absorbed on the surface and was being removed by the evacuation.

Activated nickel surfaces can be modified by dipping for a few seconds in aqueous hydrogen peroxide. A three volume percent $H_2O_2$ solution modifies the surface and turns is black so that it is no longer pyrophoric. The modified surface is however still catalytic and will for example show a strong decrease in overvoltage when used as a cathode or anode in electrolyzing aqueous NaOH to generate gas. The activation of platinum or its alloys can be similarly modified by immersion in aqueous $H_2O_2$ or in aqueous HCl at least 20% strong.

A pyrophoric activated surface will retain its pyrophoricity for some time if kept covered by an inert fluid—even argon gas—or by a dried film of caustic soda or sodium silicate. Such drying is best conducted in an inert atmosphere. The pyrophoricity is enhanced by applying to the surface a pervious layer of material that accentuates heat generation. Thus a pyrophoric nickel screen can be momentarily dipped into a 1% solution of picric acid in water, and then dried in argon. Upon subsequent exposure to air it generates much more heat than a correspondingly activated nickel not dipped in the solution.

The foregoing intensifying effect is obtained with other heat-triggered materials such as trinitro toluene, ammonium nitrite, ammonium nitrate and triethanolamine. For intensification the triethanolamine layer should weigh less than one milligram per square centimeter, at least in spots. Intensification is also obtained with surfaces that before intensification show only a relatively low degree of pyrophoricity—such as a temperature rise of only about 50° F.

Inert fluids used to cover and preserve the pyrophoric surface are those that are inert to active hydrogen and nickel. Thus saturated hydrocarbon liquids like n-heptane or any of the nonane isomers make very effective preserving films, and if they are kept from evaporating off as by sealing such a filmed pyrophoric nickel in an argon armosphere, will preserve the pyrophoricity for months. Methyl ethyl ketone can also be used this way as a preserving film inasmuch as it is sufficiently inert.

Readily vaporizable preserving films, such as those having boiling points below about 125° C. also have the advantage of permitting pyrophoric action to develop by merely exposing the filmed surface to the open air so that the film evaporates within 1 or 2 minutes.

The presence of a liquid saturated hydrocarbon film preserves the pyrophoricity better than the mere sealing in an inert gas without such film. Preservation of pyrophoricity can also be accomplished by maintaining a blanket or atmosphere of hydrogen around the activated metal.

The pyrophoric action can also be used to ignite materials that then burn to deliver very large quantities of heat. Thus a magnesium ribbon about 4 mils thick can be rolled against a pyrophoric nickel foil that is protected by any of the above-noted coatings, the rolling being effected under a pressure great enough to cause the ribbon to adhere to the foil. A force of 500 lbs. for example applied to such a ribbon by the semicylindrical nose of an anvil in which the cylindrical radius is # inch and the cylinder length ¾ inch, while the foil is backed up by a flat support, will cause the ribbon to adhere to the foil along a thin line corresponding to the peak of the semicylindrical nose, if the force is maintained for about 10 seconds.

The presence of a protective layer such as triethanolamine on the foil does not prevent such adhesion. A magnesium ribbon about ¼ inch wide secured this way will be ignited when the protective layer is washed off and the washed foil dries out and becomes pyrophoric. The ignition of the ribbon generally starts at one point and the ribbon then burns along its length becoming incandescent, very much like an unsupported magnesium ribbon burns. A clean titanium foil can also be ignited this way.

Holding a fine-wire thermocouple against the surface of the nickel foil while it becomes pyrophoric (without any pyrophoricity-increasing material on it) indicates that surface reaches a peak temperature of about 1600° F. If some triethanolamine or picric acid is on that surface in an amount that does not prevent the development of pyrophoricity, the thermocouple indicates peak temperatures as high as 1700° F. or even higher.

A pyrophoric iron foil prepared like a pyrophoric nickel foil shows somewhat lower peak surface temperatures—generally about 800° F.—but takes a longer time to cool down. This apparent inconsistency may be made to a difference in the type of chemical change accompanying the pyrophoric action. It appears the nickel surface becomes converted to NiO, and the iron surface to $Fe_2O_3$ and/or $Fe_3O_4$ either of which conversions call for more heat liberation than the conversion of Ni to NiO. The iron conversion might also be effected in stages so that heat is generated in stages and the heat generated by the first stage is partly dissipated before the next heat generation stage. Also the quantity of hydrogen adsorbed on the iron seems smaller than that adsorbed on the nickel.

It is preferred to leach the aluminized iron under relatively mild conditions, as by using 10% NaOH in water at 140°-160° F. for 15 to 20 minutes. More vigorous leaching leaves the iron with reduced pyrophoricity and also seems to cause some of the surface iron to slough off.

A very effective magnesium flare can be made by intimately adhering a pyrophoric strip of metal to a magnesium ribbon so as to cause the metal to become pyrophoric when exposed to air and to then ignite the magnesium. The pyrophoric strip can be larger or smaller than the magnesium ribbon. The length of the ribbon will generally determine the burning time, and the pyrophoric strip need be no larger than is sufficient to insure the ignition of the ribbon. Two or more pyrophoric strips can be adhered to different portions of a ribbon to help assure that it becomes ignited or to start it burning at different locations.

A half-minute flare can consist of a six inch length of magnesium ribbon about 3 mils thick and ¼ inch wide, with a one-inch by half-inch strip of pyrophoric nickel foil rolled onto one end. The combination has a low density and when dropped from an airplane will ignite and fall like a leaf at a relatively slow rate. Making the ribbon thinner and wider further reduces the rate of fall, so that a parachute is not needed to slow its descent. To prevent premature ignition the pyrophoric strip can have its surface protected against premature exposure to air, as by packing it under a protective atmosphere or a protective liquid, in an air-tight container. The protective atmosphere can be nitrogen, argon or hydrogen for example, and the protective liquid can be a readily evaporated one such as water, methanol or nonane.

A number of such magnesium flares can be packed into a single small container fitted like a shot-gun shell with a small propellant charge sufficient to expel the flares when fired from a shot-gun breech. Alternatively they can be packed in a container having a readily torn-off tear strip that opens the container when torn off and permits the flares to be ejected by whirling the open container to apply centrifugal force to the flares inside. If desired the container can be made of combustible material like paper that is itself ignited and consumed by a burning flare. The paper of such a container can be impregnated with wax or the like to make it gas-tight. A small amount of explosive can also be packed in the container to be detonated by the ignition of a flare and thus expel the flares and/or fragment the container.

For the production of large quantities of foil or ribbon, it is convenient to start with a coil of suitable material available in the market place. Thus a coil of 1 to 1.5 mil thick nickel or iron foil about six inches wide can be prepared for diffusion coating by unwinding it, passing the foil as it unwinds through a cleaning station where it can be electrolytically cleaned as a bipolar electrode in aqueous caustic, or abrasively cleaned on both sides by an air-propelled stream of fine glass grit, and coiling up the cleaned foil with one or more spacers that keep the adjacent coil turns spaced from each other. A thin layer of powdered diffusion coating pack makes an effective spacer. Only about ⅛ inch spacing is needed between turns, but the spacing can be as great as ¼ inch if desired.

The powdered spacing layer can be retained in place as by winding a continuous length of a twisted pair of wires into the recoiling so that the twisted wires extend along an edge of the foil and keep the powder from spilling out that edge, yet provides an adequate number of small gaps with respect to the foil surface it engages, to permit the diffusion coating atmosphere to penetrate. Two separate lengths of twisted wires can be used, one length at each edge of the foil.

The wires can be made of the same metal as the foil, or they can be made of aluminum or of plastic that is decomposed and driven off during the diffusion coating treatment. Acrylic plastics are particularly suitable for this purpose. Such twisted wires can be wound into the coil as spacers without the layer of diffusion coating pack, and the pack then vibrated into the spaces by standing the space-wound coil by its edge on a plate, covering its top with powdered diffusion coating pack, and subjecting the plate to vibration to cause the powder to work its way into the spaces between turns.

Alternatively the spacing layer of diffusion coating pack can be applied without supplemental devices for keeping the layer from spilling out prematurely. To this end the layer can be applied as a wet but non-flowing paste mixture or gel extruded onto the foil. A small content, such as ½% of a thixotropic polymer such as polyacrylic acid mannan gum, added as a stirred solution in a readily vaporized solvent such as methyl ethyl ketone, to a standard diffusion coating mixture, does a good job of producing an extrudable gelled mixture.

The rewound foil with its spaced turns can then be packed in additional powder pack in a diffusion coating retort and subjected to the diffusion coating treatment. The rewound mass can be kept from unwinding during handling, as by wrapping lengths of the twisted wire or plastic around it, and securing the ends of these lengths together.

After the diffusion coating is completed, the treated coil is removed from the retort and the pack particles can be removed from between the turns. Because the foil is very brittle at this stage of the treatment, care is needed to keep from damaging it. The coil can have its outer wrap removed, stood by its side edge on a screen, and subjected to vibration to vibrate the pack particles down from between the coil turns and through the screen. Without uncoiling, the coil is then lowered into a leaching bath, such as 10 to 20% aqueous NaOH, to dissolve out the diffused-in metal.

When the leaching is completed the foil is no longer objectionably brittle, and it can be manipulated, even though as much as ⅓ of the diffused-in metal has not been leached out. However it must be protected against exposure to air or oxygen, until ready for use. The coiled foil can for example be kept wet with a layer of nonane or triethanolamine and then slit and chopped to reduce it to individual rectangular foils of a convenient size such as ½ by 1 inch. A quantity of such individual foils can then be packed in a container for pyrophoric use elsewhere, as discussed above in connection with the flares. The nonane prevents premature pyrophoric action, but when a very thin layer is exposed to air it will evaporate away from about ¼ minute so that such action will then commence.

Instead of slitting the final coil completely apart, the coil can be run through a perforating machine that cuts interrupted slits through it, longitudinally as well as transversely, leaving only a few unperforated points holding the individual small foils together. The thus-perforated material can then be rewound into a tight coil and packed in a container. Such a container can be fitted with an explosive charge as noted above, so that the coil can be expelled when desired, and the charge can be sufficiently strong to tear the coil into its individual perforated pieces.

The perforating treatment can be applied before the diffusion coating, instead of after. Regardless of the manner of preparation, the leached foil can be coated with picric acid, sodium picrate, triethanolamine or other material that increases its pyrophoric action.

The foil need not be a pure metal, but can be an alloy such as an alloy containing chromium or copper, and/or can have a laminated construction. An iron foil can for example be plated with a very thin layer, about 0.1 to 0.5 mil thick, of nickel on one or both surfaces. On the other hand a suitable foil can be made of an alloy of iron and nickel containing 1% to 99% of either metal. A little carbon dispersed in or alloyed with the metal, even 0.1 to 1% is helpful, as is a small content of other ingredients such as magnesium that are easily ignited.

The pyrophoric metal web can be in the form of a screen. Thus a 100 mesh screen of 10 mil thick nickel wire can have 38 milligrams of aluminum diffused into it, which after 1 to 1½ hours leaching with boiling 20% NaOH in water, becomes highly pyrophoric and merely left to dry will undergo a violent explosion.

A readily ignited metal such as titanium or magnesium in foil or wire form can also be given a nickel coating, as by rolling, and the nickel coating then rendered pyrophoric. To ignite the ignitable metal the coating should be at least about 0.4 mil thick.

The pyrophoric metals, regardless of how they are produced, can be plated as by electrolytic coatings from alkaline cyanide baths, of zinc, cadmium, silver, tin or copper without significantly diminishing their pyrophoricity. Such coatings that are over about 0.2 mil thick will significantly reduce the pyrophoric action.

The above-described electrolytic foil formation by plating nickel on aluminum and dissolving the aluminum, can also be used to make a solar panel. To this end a 20-mil thick aluminum sheet one foot square can have a number of uniformly-distributed 40-mil-wide holes punched through it, and it can then be plated with a 5 mil thick layer of nickel. The plating is effected at relatively high cathode current density, about or more amperes per square foot, to cause the plating to penetrate through the holes and securely coat the aluminum surface in each hole. Two opposing side edges of the coated product are then trimmed off to expose the aluminum, and the thus-treated material immersed in a boiling 20% aqueous solution of NaOH to dissolve out the aluminum.

What is left is a hollow panel that has spaced nickel foils walls secured to each other by uniformly-distributed nickel posts formed where the holes in the aluminum were located, and by nickel edges where the plating was not trimmed off. A fluid supply line can be cemented to one open edge of the panel where the plating was trimmed off, and another line cemented to the opposite open edge, so that fluid can be passed through the panel and thus heated by the sun when the panel is exposed to sunshine. Because the total volume of fluid thus heated per unit of panel surface is quite low and it is all in very close contact with whichever panel wall is exposed, the fluid heats up to a relatively high temperature after only a few inches of travel through the panel. The total mass of material thus exposed to the weather is also very small so that it does not have to be protected against cooling when the sun is not shining. So long as the fluid is not circulating the cooling will not affect the temperature of a body of fluid previously heated by passage through the panel. Indeed the fluid can be water that is permitted to freeze in the panel during cold nights, inasmuch as the panel walls are fairly yieldable and will not be harmed by such freezing. It is desirable however to drain the liquid from the supply and return lines before such freezing is permitted.

These hollow panels can be made with their walls as little as 5 mils apart, or as much as 40 or more mils apart. The larger widths are also easily provided by plating the nickel on a sheet of wax or other readily melted material that has its surface rubbed with graphite or coated with other electrically conductive material that permits the desired plating. Such a wax sheet can be extruded with both side edges having enlarged beads, so that the plating around the beads forms the fluid supply and removal lines for the panel that is plated between the beads. One end of each of these lines can then be trimmed off to expose the wax, and the wax then melted and drained through the resulting openings.

Copper or other metal can be substituted for the nickel that is plated. Panels having their walls as much as ¼ inch apart are readily made this way. Reenforcing posts can be about an inch apart for panels having walls 5 mil thick, and 2 inches or more apart when the walls are thicker. For the thicker panels extra precautions are needed to make sure the platings form sufficiently effective posts. For example extra plating anodes can be fitted into the holes formed in the wax or aluminum to make sure adequate electrolytic deposition takes place there.

Another example is to chromize low carbon steel containing less than 0.10% carbon, or preferably low carbon stabilized steel containing a stabilizer such as titanium or colombium in the amount of about five to seven times the carbon content, or relatively pure iron, and subsequently dissolve out the iron core with hot dilute solutions of nitric acid preferably about 15 to 40% nitric acid by weight.

Obviously many modifications and variations of the present invention are possible in the light of the above teachings. It is, therefore, to be understood that within the scope of the appended claims the invention may be practiced otherwise than as specifically described.

What is claimed:

1. A self-supporting metal web having a pyrophoric surface covered by a solid or liquid coating that does not block the pyrophoric property and undergoes a pyrophoricity-intensifying exothermic change when subjected to the pyrophoricity of that surface.

2. The combination of claim 1 in which the coating is picric acid, trinitrotoluene, ammonium nitrate, ammonium nitrite, triethanolamine, magnesium or titanium.

3. The combination of claim 1 in which the metal is iron.

4. The combination of claim 1 in which the metal is nickel.

5. A metal web not more than about 3 mils thick, the surface of the metal being pyrophorically activated and a stratum of readily ignitable metal secured to that surface and in sufficiently intimate contact to be ignited by the metal web when that web becomes pyrophoric.

6. The combination of claim 5 in which the readily ignitable metal is magnesium.

7. The combination of claim 5 in which the pyrophorically activated surface is selected from the class consisting of nickel and iron.

8. The combination of claim 5 in which the readily ignitable metal is a length of ribbon rolled into coherent engagement with the pyrophoric metal web.

* * * * *

UNITED STATES PATENT AND TRADEMARK OFFICE
CERTIFICATE OF CORRECTION

PATENT NO. : 4,349,612
DATED : September 14, 1982
INVENTOR(S) : ALFONSO L. BALDI It is certified that error appears in the above-identified patent and that said Letters Patent is hereby corrected as shown below:

Column 1, line numbered 19, "No. 3,948,968" should be-- 3,948,689--

Column 6, line numbered 17, "#" should be--1/8--

Column 8, line numbered 44, "from" should be--after--

Signed and Sealed this

Twenty-ninth Day of March 1983

[SEAL]

Attest:

GERALD J. MOSSINGHOFF

Attesting Officer

Commissioner of Patents and Trademarks